US011503719B2

(12) United States Patent
Drew et al.

(10) Patent No.: US 11,503,719 B2
(45) Date of Patent: Nov. 15, 2022

(54) ELECTRICAL COMPONENT AND METHOD FOR THE PRODUCTION THEREOF

(71) Applicant: VITESCO TECHNOLOGIES GMBH, Hannover (DE)

(72) Inventors: Gregory Drew, Munich (DE); Thomas Riepl, Munich (DE); Detlev Bagung, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 220 days.

(21) Appl. No.: 16/755,656

(22) PCT Filed: Oct. 4, 2018

(86) PCT No.: PCT/EP2018/077065
§ 371 (c)(1),
(2) Date: Apr. 13, 2020

(87) PCT Pub. No.: WO2019/072690
PCT Pub. Date: Apr. 18, 2019

(65) Prior Publication Data
US 2020/0288579 A1    Sep. 10, 2020

(30) Foreign Application Priority Data
Oct. 11, 2017    (DE) .......................... 102017218131.1

(51) Int. Cl.
*H05K 3/28*    (2006.01)
*H01F 27/02*    (2006.01)
(Continued)

(52) U.S. Cl.
CPC ........... *H05K 3/284* (2013.01); *H01F 27/022* (2013.01); *H01F 27/06* (2013.01); *H05K 7/12* (2013.01);
(Continued)

(58) Field of Classification Search
CPC .. H01F 27/022; H01F 27/06; H01F 2027/065; H05K 3/284; H05K 7/12; H05K 2203/1316
See application file for complete search history.

(56) References Cited

U.S. PATENT DOCUMENTS 4,748,294 A    5/1988    Bartel et al.
6,546,982 B1 *    4/2003    Brown ................ B60C 23/0433
29/601
(Continued)

FOREIGN PATENT DOCUMENTS

DE    102006026364 A1    8/2007
DE    102009016762 B4    10/2016
(Continued)

*Primary Examiner* — Carl J Arbes
(74) *Attorney, Agent, or Firm* — Laurence A. Greenberg; Werner H. Stemer; Ralph E. Locher

(57) ABSTRACT

An electrical component includes an electrical part and a flat carrier on which the electrical part is disposed. A housing accommodates the carrier with the electrical part such that the part on the carrier is situated opposite a housing section to which the carrier is connected. An annular casing composed of a flexible material completely surrounds the electrical part and bears against the carrier by way of its first end and against the housing section by way of its second end. A potting compound surrounds the electrical part within the casing and at least partially fills the free volume. A method for producing an electrical component is also provided.

14 Claims, 1 Drawing Sheet

(51) Int. Cl.
*H01F 27/06* (2006.01)
*H05K 7/12* (2006.01)
(52) U.S. Cl.
CPC .............. *H01F 2027/065* (2013.01); *H05K 2203/1316* (2013.01)

(56) References Cited

U.S. PATENT DOCUMENTS 7,832,278 B2 * 11/2010 Sham .................... G01L 19/148
73/754
2011/0267834 A1 * 11/2011 Potucek .................. F21V 29/59
362/267

FOREIGN PATENT DOCUMENTS

| EP | 0138068 | A2 | | 4/1985 |
|----|---------|----|---|--------|
| GB | 585308 | A | | 2/1947 |
| GB | 814832 | A | | 6/1959 |
| WO | 2010065113 | A1 | * | 6/2010 |
| WO | 2016177629 | A1 | | 11/2016 |

* cited by examiner

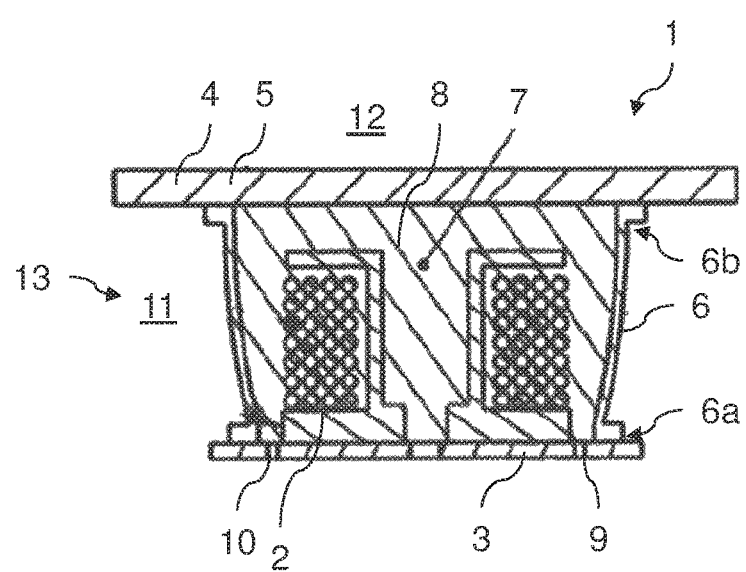

ELECTRICAL COMPONENT AND METHOD FOR THE PRODUCTION THEREOF

BACKGROUND OF THE INVENTION

Field of the Invention

The invention relates to an electrical component in which an electrical part is embedded in a potting compound in a housing. The invention further relates to a method for producing the electrical component.

In some electrical components, it is necessary for the number of high-power electrical parts, such as transformers, capacitors and the like for example, which are arranged in a housing of the electrical component to be embedded in a potting compound for mechanical reasons and reasons of heat dissipation. For this purpose, the electrical parts are typically arranged in a trough-like housing structural part. After electrical contact is made with said electrical parts and functioning of said electrical parts is tested, the trough with the electrical parts arranged therein is completely filled with potting compound. The potting compound is then cured, so that the electrical parts which are arranged in the trough are mechanically protected, for example against vibrations, and heat can be dissipated to the housing structural part via the potting compound.

One problem is that a defect in one of the electrical parts that occurs after potting can no longer be remedied since the electrical part is no longer accessible, so that the electrical component as a whole has to be discarded. This is economically unacceptable, particularly in the field of vehicles in which an electrical component of this kind is associated with high costs. A further disadvantage of this procedure is that the position of the electrical parts in the trough-like housing cannot be readily changed, for example on account of design requirements. The production of an electrical component in the manner described is therefore inflexible with regard to modifications or the formation of derivatives. Furthermore, an electrical component of this kind is heavy and expensive on account of the combination of trough-like housing and potting compound.

There is a need to simplify an electrical component in terms of the ability to manufacture it. In particular, the intention is to ensure that if defects occur after the electrical component has been manufactured, partial replacement of the defective parts is also rendered possible.

SUMMARY OF THE INVENTION

The object of the present invention is to specify an electrical component which meets the abovementioned requirements. A further object is to specify a method for producing the electrical component.

These objects are achieved by an electrical component as described below and a method for the production thereof as described below. Advantageous refinements are evident from the dependent patent claims.

The invention proposes an electrical component which comprises an electrical part. The electrical part is arranged on a flat carrier. A housing accommodates the carrier with the electrical part, so that the part on the carrier is situated opposite a housing section of the housing, to which housing section the carrier is connected. An annular casing composed of a flexible material is additionally provided, which casing completely surrounds the electrical part and bears against the carrier by way of its first end and against the housing section by way of its second end. A potting compound surrounds the electrical part within the casing and at least partially fills the free volume.

In the case of the present electrical component, individual or a plurality of electrical parts can be surrounded in a targeted manner by a potting compound by providing an annular casing. As a result, the electrical part or parts which is/are arranged within the casing are protected against mechanical influences (for example vibrations) and environmental influences (for example moisture). Furthermore, heat can be removed from the electrical part or parts via the potting compound since there is also a connection to the housing. In this case, the term "annular" is intended to be understood in broad terms. These include round casing shapes as well as casing shapes which differ from the circular shape, for example elliptical or polygonal casing shapes. It is important for the casing to have a closed cross section, so that no potting compound can exit via the casing surface.

The electrical component can have one or more structural units with an electrical part which is individually surrounded or electrical parts which are individually surrounded by potting compound. It is likewise possible for other electrical parts or structural units to also not be surrounded by potting compound in the case of an electrical component of this kind. As a result, it is possible to remove individual electrical parts or structural units from the housing if replacement is required, for example on account of a defect. As a result, the further parts or structural units which are arranged in the housing can continue to be used after replacement.

An electrical component of this kind firstly renders possible the required reliable heat dissipation from electrical parts of this kind which heat up to a considerable extent during operation. To this end, the potting compound which is provided with thermally conductive properties is used in a known manner. Heat is removed by the thermal contact between the potting compound and the housing.

A further result is improved manufacturing capability. In particular, a greater degree of flexibility is provided in the case of subsequent replacement of individual components, be they surrounded by a potting compound or not.

On account of it no longer being necessary to fill the entire housing of the electrical component with a potting compound, the weight of the electronic component can be considerably reduced.

A further advantage is that the flexibility in the arrangement of different electrical parts or other components of the electrical component is improved.

A further expedient refinement makes provision for the flat carrier to be a printed circuit board with which the electrical part makes electrical contact. The flat carrier can be in contact with potting compound on its main side, which is associated with the casing, or not.

A further expedient refinement makes provision for the flat carrier to comprise at least two cutouts within the circumference of the casing, which cutouts connect the interior space, which is enclosed by the casing, to the surrounding area, in particular the housing interior. Owing to the provision of at least two cutouts, it is possible to introduce the potting compound in a targeted manner into the interior space which is delimited by the casing, the housing section and the printed circuit board.

It is expedient when the casing is connected to the carrier in a form-locking or cohesive or force-locking manner. This renders possible the provision of a prefabricated structural unit for producing the electrical component. In particular, the management of the production process for the electrical component is simplified as a result.

It is furthermore expedient if the casing is connected to the housing section in a force-locking manner. Owing to the design of the casing from a flexible material, for example a rubber, an adequate force-locking (pressurized) connection to the housing section can be established by the material and possibly the shaping of said material. In particular, the flexible properties of the material of the casing also ensure that any tolerances which may be present (for example an inexact parallelism between the housing section and the printed circuit board) can be compensated for within certain limits. In particular, mechanical loads on the printed circuit board can also be avoided as a result.

It is furthermore expedient if the potting compound within the casing always adjoins the housing section irrespective of the degree of filling of the free volume with the potting compound. In this way, effective removal of heat from the electrical part via the housing, which consists of a pressure casting or another material for example, can be ensured in a particularly simple manner. In another alternative, provision can be made for the interior space which is formed by the casing, the housing section and the printed circuit board to be completely filled with the potting compound. The extent to which the interior space is filled by the potting compound can be selected depending on the required mechanical properties and the requirements in respect of removal of heat.

It is expedient if the potting compound has heat-conducting properties in order to ensure effective removal of heat from the electrical structural element or elements.

A further expedient refinement makes provision for the potting compound to be formed from a material of the kind which has viscous properties during processing and cures or can be cured after processing. The viscous properties of the potting compound allow the potting compound to be introduced into the interior of the circumference of the casing through some of the cutouts. The air which is displaced when the potting compound is introduced into the interior space can exit from the interior space through some of the other cutouts. This ensures that no unintended cavities are produced in the interior of the casing.

According to an expedient refinement, the electrical structural element is a transformer. However, in principle, all electrical components of the kind from which heat has to be effectively removed on account of their high heat output during operation can be considered to be an electrical structural element. These are, for example, capacitors, switching elements and the like.

The object is further achieved by a method for producing an electrical component of the kind described in this document. The method comprises the following steps: providing a housing having a housing section; providing a structural unit which comprises the carrier having the at least two cutouts, the electrical part and the annular, flexible casing, wherein the electrical part is arranged on the carrier and encircled by the casing, so that an annular contact line between the circumference of the casing at its second end and the carrier is sealed; fastening the structural unit to the housing for the purpose of providing an intermediate component in such a way that the part is situated opposite the housing section and the casing bears against the housing section in a sealing manner; arranging the intermediate component such that the housing section lies below the carrier in the direction of gravity; and introducing the potting compound into the interior of the casing through some of the at least two cutouts.

The electrical component which is designed according to the invention can comprise a plurality of structural units as described above. In addition to one or more structural units, the electrical component can also comprise further components, such as electrical parts, mechanical parts and the like for example, which form the electrical component as a whole.

In an expedient refinement of the method, curing of the potting compound, for example by heat treatment, is provided as a further step.

The invention is described in greater detail below with reference to an exemplary embodiment in the drawing.

BRIEF DESCRIPTION OF THE SINGLE VIEW OF THE DRAWING

The single FIGURE shows a cross-sectional illustration of a detail of an electrical component according to the invention.

DETAILED DESCRIPTION OF THE INVENTION

The FIG. shows a detail of an electrical component 1 according to the invention. The electrical component 1 comprises a housing 4, of which only a housing section 5 is illustrated. The housing section 5 in the cross-sectional illustration is of flat design merely by way of example. The housing interior is provided, by way of example, with the reference symbol 11, and the area surrounding the housing is provided with the reference symbol 12.

A structural unit 13 is arranged in the housing interior 11. The structural unit 13 comprises a carrier 3, for example a printed circuit board (PCB), an electrical part 2 (in the present exemplary embodiment a transformer) which is arranged on the carrier 3, and also an annular casing 6 composed of a flexible material, for example rubber. In addition to mechanically fastening the electronic part 2, the carrier 3 serves for electrical contact-connection of said electronic part. To this end, the carrier 3 can have, in a manner known to a person skilled in the art but not illustrated in any detail in the figures, one or more printed circuit boards, wire connections and the like. In the present exemplary embodiment, the carrier 3 is arranged substantially parallel to the housing section 5. The carrier 3 is connected to the housing section 5 or another part of the housing 4 by means of fastening elements, not illustrated in any detail in the FIGURE, so that the relative position of the carrier 3 in relation to the housing section 5 illustrated in the FIGURE is produced.

The casing 6 is connected, at its first end 6a, to the carrier 3 in such a way that said casing completely encircles the electrical part 2. The casing 6 can be connected, at its first end 6a, to the carrier 3 in a form-locking, force-locking or cohesive manner. Adhesive bonding is conceivable for example.

The casing 6 has a substantially cylindrical shape in cross section and, on account of its material properties and/or shaping, is provided with slightly resilient or elastic properties, so that it is pressurized in the shown relative position of the carrier 3 in relation to the housing section 5 and is supported on the housing section 5. This ensures that the casing 6 seals off the interior space 7, which is delimited by the casing 6, the housing section 5 and the carrier 3, not only at its first end 6a, by way of which it bears against the carrier 3, but rather also at its second end 6b, by way of which it bears against the housing section 5.

The carrier 3 has, by way of example, two cutouts 9, 10 within the circumference of the casing 6. A potting compound 8 is pressed into the interior space 7 via one of the two cutouts 9 or 10. In the process, displaced air can escape through the other of the two cutouts 10 or 9, so that it is possible, in principle, to completely fill the interior space 7 with the potting compound 8. Since it is possible for the air to escape from the interior space 7, no air pockets, which prevent the dissipation of heat from the electrical part 2 to the housing section 5 via the potting compound 8, can be established. In an alternative refinement, it is also possible to only partially fill the interior space 7 with the heat-conducting potting compound 8.

The potting compound, for example composed of silicone, has viscous properties during the introduction into the interior space 7. The potting compound can be cured to a prespecified extent by a heat-treatment step.

The electrical component, which can comprise one or more structural units 13, as illustrated in the FIG., and optionally further components which are arranged directly in the housing 4, is produced as follows:

In a first step, the housing 4 is provided, which housing comprises a number of housing sections 5 which corresponds to the number of structural units 13 to be arranged in the housing 4.

A respective structural unit 13 is provided by arranging the electrical part 2 on the carrier 3. In one variant, more than one electrical part can be arranged on the carrier 3 in the structural unit 13. The annular, flexible casing 6 is then arranged on the carrier 3, so that the casing 6 encircles the electrical part 2. The casing 6 is connected to the carrier 3, for example on account of its shaping and the shaping of the carrier 3, on account of a cohesive connection (for example by welding) or by adhesive bonding etc. In this case, the casing 6 has a length which protrudes beyond the electrical part 2.

In a next step, the structural unit 13 is fastened to the housing 4 in such a way that the part 2 is situated opposite the housing section 5. The structural unit 13 is fastened to the housing, for example, by screws, bolts and appropriate, corresponding mating parts of the housing. In the process, the casing 6 comes to rest against the housing section 5 in a sealing manner. The intermediate component which is formed in this way is then arranged in space such that the housing section 5 lies below the carrier 3 or the structural unit 13 in the direction of gravity. The potting compound 8 is then introduced into the interior of the casing 6 through some of the at least two cutouts 9, 10. In the process, the interior of the casing 6 can be partially or completely filled with the potting compound 8. The potting compound 8 is then cured.

The invention claimed is:

1. An electrical component, comprising:
   a housing having a housing section;
   a flat carrier connected to said housing section;
   an electrical part disposed on said flat carrier;
   said flat carrier with said electrical part being accommodated in said housing and said electrical part on said flat carrier being situated opposite said housing section;
   an annular casing being separate from said flat carrier and said housing section, said casing composed of a flexible material and having first and second ends, said casing completely surrounding said electrical part, said first end of said casing bearing against said flat carrier and said second end of said casing bearing against said housing section; and
   a potting compound surrounding said electrical part within said casing and at least partially filling a free volume in said casing.

2. The electrical component according to claim 1, wherein said flat carrier is a printed circuit board with which said electrical part makes electrical contact.

3. The electrical component according to claim 1, wherein said casing has a circumference and encloses an interior space, said flat carrier has at least two cutouts within said circumference, and said at least two cutouts connect said interior space to a surrounding area.

4. The electrical component according to claim 3, wherein said surrounding area is an interior of said housing.

5. The electrical component according to claim 1, wherein said casing is connected to said flat carrier in a form-locking or cohesive or force-locking manner.

6. The electrical component according to claim 1, wherein said casing is connected to said housing section in a force-locking manner.

7. The electrical component according to claim 1, wherein said potting compound within said casing always adjoins said housing section irrespective of a degree of filling of said free volume with said potting compound.

8. The electrical component according to claim 1, wherein said potting compound is thermally conductive.

9. The electrical component according to claim 1, wherein said potting compound is formed of a material having viscous properties during processing and cures or is curable after processing.

10. The electrical component according to claim 1, wherein said electrical part is a transformer.

11. A method for producing an electrical component, the method comprising the following steps:
    providing a housing having a housing section;
    providing a structural unit including an electrical part, a flat carrier connected to the housing section and having at least two cutouts, and an annular, flexible casing being separate from the flat carrier and the housing section, the casing having first and second ends, the electrical part being disposed on the flat carrier in the housing and encircled by the casing for sealing an annular contact line between a circumference of the casing at the first end and the flat carrier;
    fastening the structural unit to the housing to provide an intermediate component having the electrical part on the flat carrier situated opposite the housing section and the second end of the casing bearing against the housing section in a sealing manner;
    orienting the intermediate component with the housing section lying below the flat carrier in the direction of gravity; and
    introducing a potting compound into an interior of the casing through at least one of the at least two cutouts to at least partially fill a free volume in the casing and surround the electrical part within the casing.

12. The method according to claim 11, which further comprises curing the potting compound in a further step.

13. The electrical component according to claim 1, wherein said first end of said casing bearing against said flat carrier has a smaller diameter than said second end of said casing bearing against said housing section.

14. The method according to claim 11, which further comprises providing the first end of the casing bearing against the flat carrier with a smaller diameter than the second end of the casing bearing against the housing section.

* * * * *